United States Patent [19]

Kubo

[11] Patent Number: 5,372,970
[45] Date of Patent: Dec. 13, 1994

[54] METHOD FOR EPITAXIALLY GROWING A II-VI COMPOUND SEMICONDUCTOR

[75] Inventor: Minoru Kubo, Nabari, Japan

[73] Assignee: Matsushita Electric Industrial Co., Ltd., Osaka, Japan

[21] Appl. No.: 81,806

[22] Filed: Jun. 23, 1993

[30] Foreign Application Priority Data

Jun. 24, 1992 [JP] Japan .................... 4-165847

[51] Int. Cl.$^5$ .............................. H01L 21/20
[52] U.S. Cl. .................... 437/129; 437/105; 437/133; 148/DIG. 64
[58] Field of Search ............ 437/129, 133, 105; 148/6, DIG. 64; 156/DIG. 72

[56] References Cited

U.S. PATENT DOCUMENTS 5,213,998  5/1993  Qiu et al. .................... 437/129

FOREIGN PATENT DOCUMENTS

| 0319207 | 6/1989 | European Pat. Off. ........... 437/129 |
| 0011760 | 3/1983 | Japan .................... 437/129 |
| 0258929 | 12/1985 | Japan .................... 148/DIG. 64 |
| 32-215398 | 9/1991 | Japan .................... 437/129 |

OTHER PUBLICATIONS

M. Sauvage-Simkin et al., *Physical Review Letters*, vol. 62, No. 5, "Fractional Stoichiometry of the GaAs(001)c (4×4) Surface: An In-Situ X-Ray Scattering Study", Jan. 30, 1989, pp. 563–566.

M. A. Haase et al. "Blue Green diodes", *Appl. Phys. Lett.* 59(11), 9 Sep. 1991, pp. 1272–1274.

Y. Horikoshi et al. "Low-Temperature Growth of GaAs and AlAs-GaAs Quantum-Well Layers by Modified Beam Epitaxy", *Japanese Journal of Applied Physics*, vol. 25, No. 10, Oct. 1986, pp. L868–L870.

Kobayashi in "Zinc selenide/Gallium arsenide heterointerface ...", Jpn. Jn. Appl. Phys. part 2,27(9), 1988, L1597–L1599.

Moriizumi et al. in "Epitaxial Vapor growth of ZnTe on InAs" in Jpn. J. Appl. Phys. vol. 9, 1970, pp. 849–850.

*Primary Examiner*—R. Bruce Breneman
*Assistant Examiner*—Ramamohan Rao Paladugu
*Attorney, Agent, or Firm*—Ratner & Prestia

[57] ABSTRACT

A method for epitaxially growing a II-VI compound semiconductor according to this invention comprises the steps of epitaxially growing a GaAs$_x$Se$_{1-x}$ layer on a GaAs substrate and epitaxially growing a ZnSe layer or a compound semiconductor layer including ZnSe on the GaAs$_x$Se$_{1-x}$ layer. This method provides a II-VI compound semiconductor in which a strain caused by a lattice mismatch is prevented and the hetero interface is excellent.

8 Claims, 8 Drawing Sheets

FIG. 4
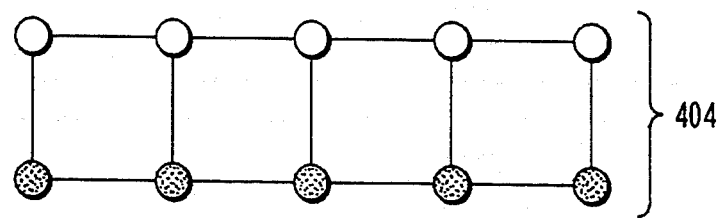
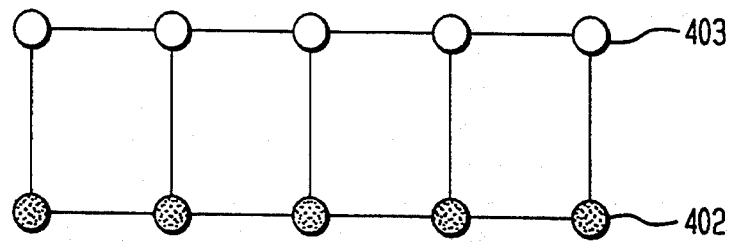
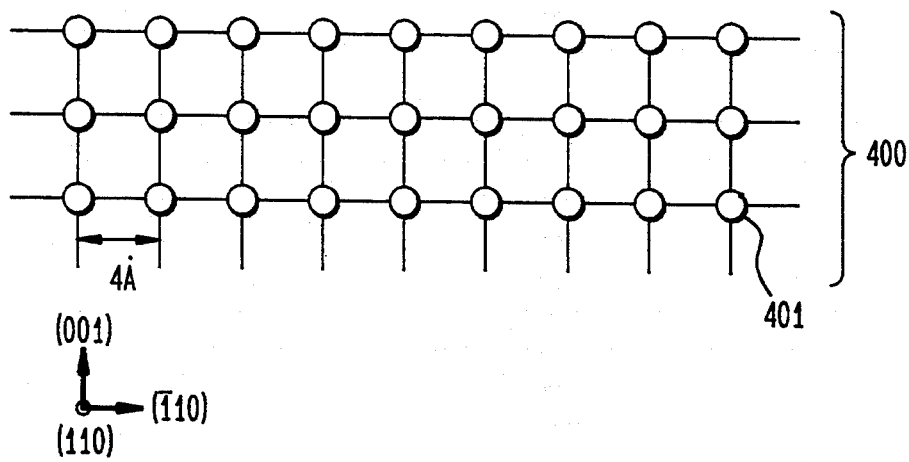

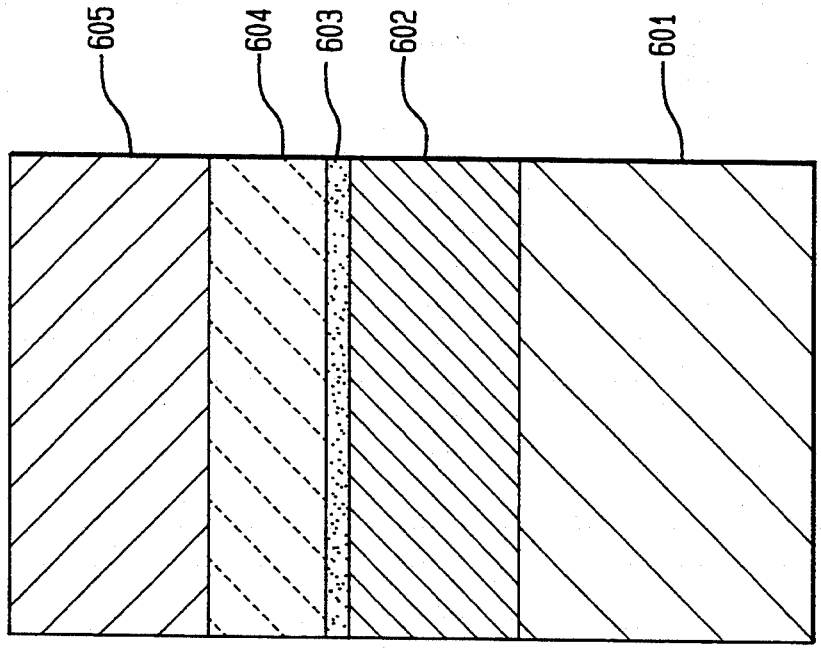
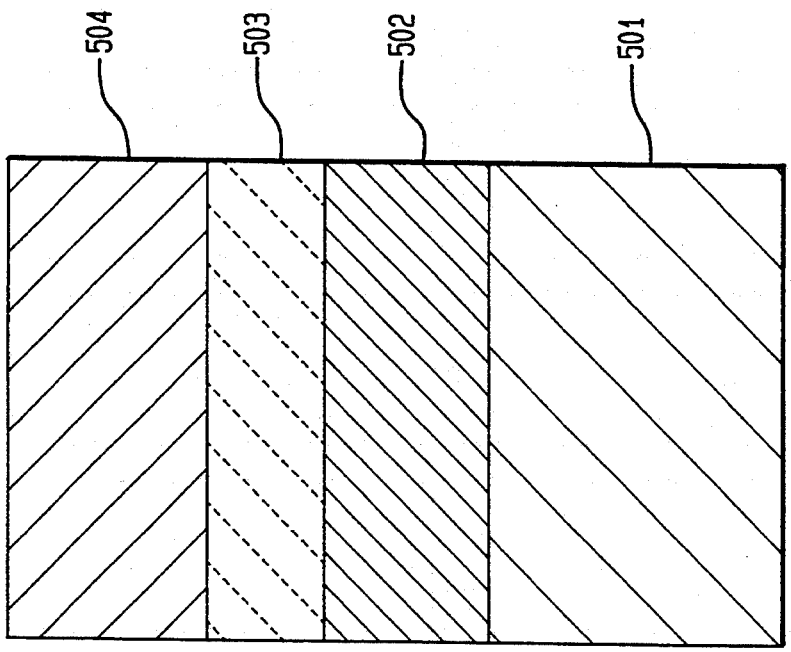

METHOD FOR EPITAXIALLY GROWING A II-VI COMPOUND SEMICONDUCTOR

BACKGROUND OF THE INVENTION

1. Field of the Invention:

The present invention relates to a method for epitaxially growing a ZnS(Se) type II-VI compound semiconductor, which is used for a blue light emitting element. More particularly, the present invention relates to a method for epitaxially growing a ZnS(Se) type II-VI compound semiconductor in which the strain and interface defects caused by a lattice mismatch with a GaAs substrate are controlled, and to a semiconductor laser element produced by the method.

2. Description of the Related Art:

A semiconductor laser will be described as an example of a conventional blue light emitting element referring to FIG. 10.

An n-type GaAs substrate 1 is loaded in a molecular beam epitaxial (hereinafter referred to as the "MBE") growth apparatus with a high vacuum. In the apparatus, the surface of the substrate 1 is heated to approximately 600° C. and irradiated with As molecular beams. The surface of the substrate 1 is thus cleaned. Then, an n-type GaAs layer 2 is grown on the substrate 1 to approximately 100 nm at the same temperature by the MBE method. An n-type ZnSe layer 3 is grown on the n-type GaAs layer 2, and then, an n-type ZnSSe layer 4, n-type ZnSe layer 5, a CdZnSe layer 6, a p-type ZnSe layer 7, a p-type ZnSSe layer 8 and a p-type ZnSe layer 9 are successively grown thereon. An element having a sectional structure as shown in FIG. 10 is thus produced (M. A. Haase, J. Qiu, J. M. DePuydt and H. Cheng, Appl. Phys. Lett. Vol. 59 1991, p. 1272). On the p-type ZnSe layer 9, an insulating film 10 is formed. A gold layer 11 and an indium layer 12 are formed as a p-type and an n-type electrodes, respectively, so as to sandwich the thus obtained laminated structure. These layers can be grown in the same or different MBE growth chambers.

The thus produced semiconductor laser can be oscillated by pulse driving at room temperature.

In the element having the above-mentioned laminated structure, the lattice mismatch between the crystal of ZnSe and that of GaAs is about 0.25%. However, the lattice mismatch between the crystal of CdZnSe or ZnSSe, that is, a mixed crystal of Zn together with Cd or together with S, and the crystal of ZnSe is significantly large. Moreover, since a coefficient of thermal expansion of the substrate between the epitaxial growth temperature and room temperature is different from that of each growth layer, a large stress is caused between the substrate and the growth layers. Dislocation is caused by such a stress in each of the growth layers, resulting in extremely shortening the life time of the semiconductor laser. Further, a difference in the band gap on the interface between GaAs and ZnSe (hereinafter referred to as the "hetero interface") is approximately 1.3 eV at room temperature, and largely prevents current injection. The hetero interface also has a problem of impurity diffusion caused by mutual diffusion between the constitutive atoms. Such an impurity can also prevent the current injection.

In this manner, in an element produced by epitaxially growing a ZnSe layer, that is, a II-VI compound layer, on a GaAs substrate, a density of dislocation is extremely high and the element has a very short life time. This is because:

a) Dislocation is caused due to a large lattice mismatch between the substrate and the ZnSe layer; and b) Dislocation is caused due to a large difference between the substrate and the ZnSe layer in the coefficient of thermal expansion from the growth temperature to room temperature.

In order to solve this problem, an MEE (migration enhanced epitaxy) (Y. Horikoshi et al., Japan J. Appl. Phys. Vol. 25, 1986, L868.) and an ALE (atomic layer epitaxy) have been used to attempt to grow layers at a low temperature. But they are not perfect methods.

In this manner, dislocation is caused and a density of the dislocation can not be reduced in such a conventional semiconductor laser. Moreover, it is considered that 50% or more of the injected current is thermally lost because of a difference in the band gap on the hetero interface of GaAs and ZnSe and a resistance component caused by mutual diffusion on the interface.

SUMMARY OF THE INVENTION

The method for epitaxially growing a II-VI compound semiconductor of this invention comprises the steps of epitaxially growing a $GaAs_xSe_{1-x}$ layer on a GaAs substrate; and epitaxially growing a layer selected from the group consisting of a ZnSe layer and a compound semiconductor layer including ZnSe on the $GaAs_xSe_{1-x}$ layer.

Alternatively, the method for epitaxially growing a II-VI compound semiconductor of this invention comprises the steps of epitaxially growing a $Ga_2Se_3$ layer on a GaAs substrate; and epitaxially growing a layer selected from the group consisting of a ZnSe layer and a compound semiconductor layer including ZnSe on the $Ga_2Se_3$ layer.

Thus, the invention described herein makes possible the advantages of (1) providing a method for epitaxially growing a II-VI compound semiconductor in which dislocation on an interface between a substrate and a growth layer is almost totally prevented; (2) providing a method for epitaxially growing a II-VI compound semiconductor in which a difference in the band gap on a hetero interface and a resistance component produced by mutual diffusion on the interface can be almost totally prevented; (3) providing a method for epitaxially growing a II-VI compound semiconductor having an excellent hetero interface on which a strain caused by a lattice mismatch is almost totally prevented by forming a $GaAs_xSe_{1-x}$ layer between a GaAs substrate and a ZnSe type layer; (4) providing a method for epitaxially growing a II-VI compound semiconductor in which a stress is buffered and dislocation is almost totally prevented by forming a $Ga_2As_3$ layer between a GaAs substrate and a ZnSe type layer; (5) providing a method for epitaxially growing a II-VI compound semiconductor in which the quality of a hetero interface is further improved by using a GaAs layer doped with Se or a Se single molecular layer doped with an impurity; and (6) providing a semiconductor laser element having a ZnSSe type II-VI compound semiconductor in which a strain caused by a lattice mismatch is almost totally prevented and an excellent hetero interface is realized.

These and other advantages of the present invention will become apparent to those skilled in the art upon reading and understanding the following detailed description with reference to the accompanying figures.

BRIEF DESCRIPTION OF THE DRAWINGS

FIG. 4 illustrates the hetero interface of the GaAs and GaSe layers in the first example of the present invention.

FIG. 5 is a sectional view of semiconductor epitaxial growth layers according to a second example of the present invention.

FIG. 6 is a sectional view of semiconductor epitaxial growth layers according to a third example of the present invention.

DESCRIPTION OF THE PREFERRED EMBODIMENTS

Figure 1:
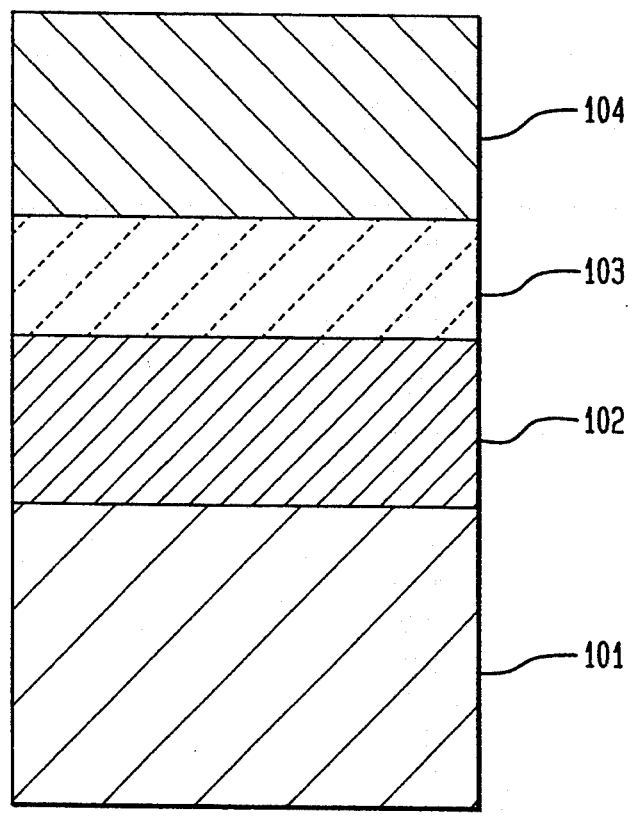
FIG. 1 is a sectional view of semiconductor epitaxial growth layers according to a first example of the present invention.

The present invention attains the above-mentioned advantages by the following two methods:

According to the first method, a $GaAs_xSe_{1-x}$ layer is epitaxially grown on a GaAs substrate, and a ZnSe layer or a compound semiconductor layer including ZnSe is then epitaxially grown thereon. A compound semiconductor having the compound semiconductor layer including ZnSe is a II–VI compound semiconductor comprising ZnSe and at least one selected from the group consisting of Cd and Hg belonging to the group IIB; Be, Mg, Ca, Sr, Bi and Mn belonging to the group IIA; S, Se and Te belonging to the group VI; and Mn belonging to the group VIIB. Examples of such a compound include CdZnSe, CdZnSeS, CdZnSeTe, MgZnSe, MgZnSeS, MgZnSeTe, MnZnSe, MnZnSes and MnZnSeTe. In the semiconductor element produced by this method, because of the $GaAs_xSe_{1-x}$ layer existing between the GaAs substrate and the ZnSe type layer (i.e., the ZnSe layer or the compound semiconductor layer including ZnSe), a strain caused by a lattice mismatch therebetween can be buffered.

The quality of a hetero interface between the GaAs layer and the ZnSe layer can be further improved by preventing a strain caused by the lattice mismatch on the hetero interface as follows: Before growing the $GaAs_xSe_{1-x}$ layer, a GaAs layer doped with Se is grown on the GaAs substrate in a manner that the content of Se is increased toward the surface of the GaAs layer; or a GaAs layer doped with Se is first grown on the GaAs substrate, and a Se layer with a thickness approximately of a single molecular (hereinafter referred to as the "Se single molecular layer") is grown on the GaAs layer doped with Se to form a Se delta-doped layer. The wording "delta-doped" herein means that an element, that is, Se in this case, is distributed in a layer without diffusing in the adjacent crystal layers, that is, the GaAs layer doped with Se, the $GaAs_xSe_{1-x}$ layer and the $Ga_2Se_3$ layer in this case.

When a GaAs layer doped with Se is grown on a GaAs substrate, it is preferable to increase the doping amount of Se toward the uppermost portion of the GaAs layer so that the density of Se in the uppermost portion is approximately $10^{21}$ cm$^{-3}$, and preferably from 1 to $5 \times 10^{21}$ cm$^{-3}$.

According to the second method, a $Ga_2Se_3$ layer is epitaxially grown on a GaAs substrate, and a ZnSe type layer (a ZnSe layer or a compound semiconductor including ZnSe) is epitaxially grown thereon. In the semiconductor element produced by this method, since the $Ga_2Se_3$ layer is disposed between the GaAs substrate and the ZnSe type layer, a stress therebetween is buffered, thereby preventing causing dislocation.

Similarly to the first method, the quality of a hetero interface between the GaAs layer and the ZnSe layer can be further improved by preventing a strain caused by the lattice mismatch on the hetero interface as follows: Before growing the $Ga_2Se_3$ layer, a GaAs layer doped with Se is grown on the GaAs substrate in a manner that the content of Se is increased toward the surface of the GaAs layer; or a GaAs layer doped with Se is first grown on the GaAs substrate, and a Se single molecular layer is grown on the GaAs layer doped with Se to form a Se delta-doped layer.

EXAMPLES

The present invention will now be described in detail by way of examples.

Example 1

Semiconductor growth layers according to this example as shown in FIG. 1 are produced as follows: A GaAs substrate 101 is loaded in an MBE growth apparatus with a high vacuum. The surface of the substrate 101 is heated to approximately 600° C. and irradiated with As molecular beams to be cleaned. A GaAs layer 102 as a buffer layer is then grown on the substrate 101 by approximately 100 nm.

After growing the GaAs layer 102, the temperature of the surface of the substrate 101 is lowered to 300° C. while being irradiating with As molecular beams. The surface structure is then confirmed to have changed from a (2×4) structure by a regular configuration of an As dimer to a c(4×4) structure.

Figure 2:
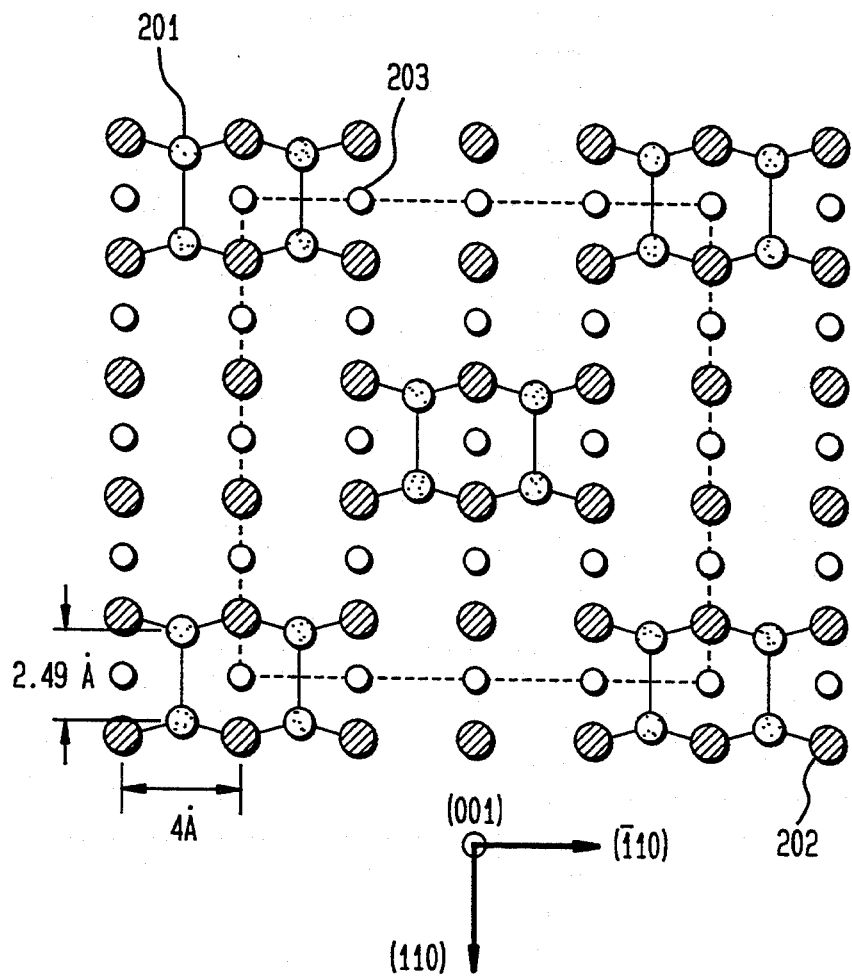
FIG. 2 illustrates the surface of a GaAs layer in the first example of the present invention.

FIG. 2 shows the c(4×4) structure, in which the surface coverage by As is increased (M. Sauvage-Simkin et al., Physical Review Letters, Vol. 62, pp. 563–566 (1989)).

While irradiating the surface of the GaAs layer 102 with As molecular beams, a $GaAs_xSe_{1-x}$ layer 103 is grown by irradiating with single molecular layer amounts of Ga molecular beams and Se molecular beams, respectively. The molecular beams are then stopped, and Se molecular beams are irradiated. It is then confirmed that the surface has a (2×1) structure, which is the Se terminal surface structure. Next, a desired ZnSe type layer is grown thereon. For example, when a ZnSe layer 104 is epitaxially grown as the ZnSe type layer, the $GaAs_xSe_{1-x}$ 103 is irradiated with molecular beams of Zn and Se. As typical growth conditions, a ratio of Zn molecular beams to Se molecular beams is approximately 1.4 at 300° C. of the surface temperature of the substrate 101, and the growth rate is approximately 1000 nm/hour.

Figure 3:
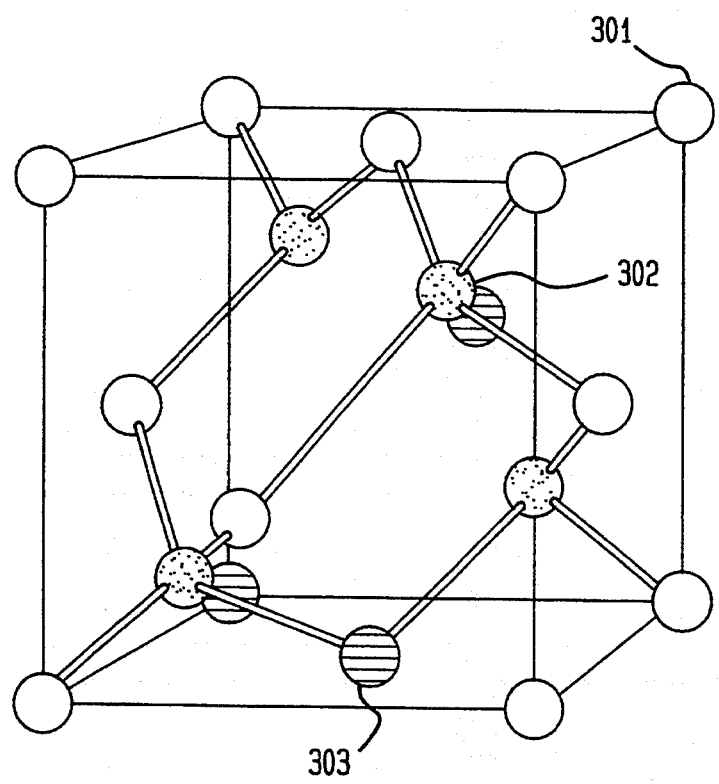
FIG. 3 illustrates the surface of a $GaAs_xSe_{1-x}$ layer in the first example of the present invention.

In the above-mentioned step, the layer formed on the GaAs substrate 101 first has a structure of a $GaAs_xSe_{1-x}$ type ternary mixed crystal as shown in FIG. 3. The thickness of the $GaAs_xSe_{1-x}$ layer is set to be from a single molecular thickness to one of several molecular thicknesses, wherein x is varied from 0 to 1 discontinuously. Although there is a large difference in the crystal structure and the lattice coefficient a between GaAs (i.e., x=1) and GaSe (i.e., x=0), the strain between these layers can be reduced by successively varying the component over several molecular layers.

The GaAs crystal has a zinc-blends structure and a lattice coefficient a of 5.657 angstroms. The GaSe crystal has a layered structure formed by the Van der Waals forces and a lattice coefficient a of 7.97 angstroms. Although the lattice coefficients are thus largely different, the unit structure of the surface of the zinc-blende structure of the GaAs crystal has an atom configuration with a size of each side of 4 angstroms. This size is approximate to 3.76 angstroms, which is one half of the lattice coefficient of the GaSe crystal.

Therefore, the lattice mismatch between these layers is 6.4% in this case. This lattice mismatch can be sufficiently buffered on the interface where x is varied from 0 to 1, that is, the interface between GaAs and GaSe.

On a hetero interface having a structure as shown in FIG. 4, a strain caused by a lattice mismatch and the effect of dislocation are buffered since the GaAs layer formed on the GaAs layer 400 has a layered structure having the Van der Waals forces even if the GaSe layer 404 has a thickness of approximately a single molecule.

Example 2

FIG. 5 shows a sectional view of a layered structure of a semiconductor laser element produced by an epitaxial growing method according to another example of this invention.

The semiconductor element has a GaAs substrate 501, a GaAs layer 502 doped with Se, a $GaAs_xSe_{1-x}$ layer 503 and a ZnSe layer 504.

When the GaAs layer 502 doped with Se atoms as an impurity is grown on the GaAs substrate 501, and the $GaAs_xSe_{1-x}$ layer 503 is grown thereon in this manner, the mutual diffusion on the hetero interface is prevented, thereby improving the abruptness of composition in each layer. The other structures and the growing method of each layer are the same as those of Example 1.

Example 3

A semiconductor laser element according to this example shown in FIG. 6 has a GaAs substrate 601, a GaAs layer 602 doped with Se, a delta-doped Se layer 603, a $GaAs_xSe_{1-x}$ layer 604 and a ZnSe layer 605.

By providing the Se delta-doped single molecular layer on the surface of the GaAs layer 602, the $GaAs_x$-$Se_{1-x}$ layer 604 formed thereon can be a GaSe layer. Since GaSe has a layered structure as mentioned above, dislocation and the like can be prevented. Other structures and the growing method of each layer are the same as those of Example 2.

Example 4

Figure 7A:
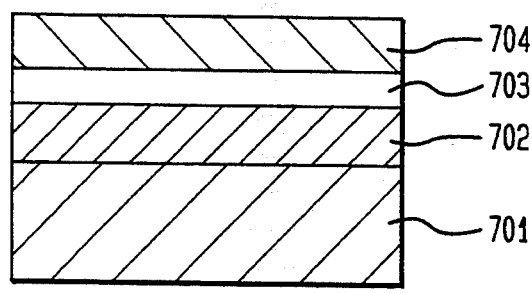
FIG. 7 is a sectional view of semiconductor epitaxial growth layers according to a fourth example of the present invention.
Figure 7B:
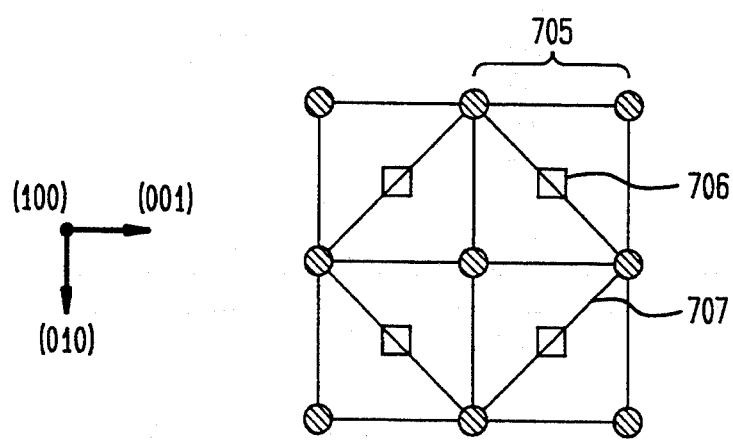
Figure 7C:
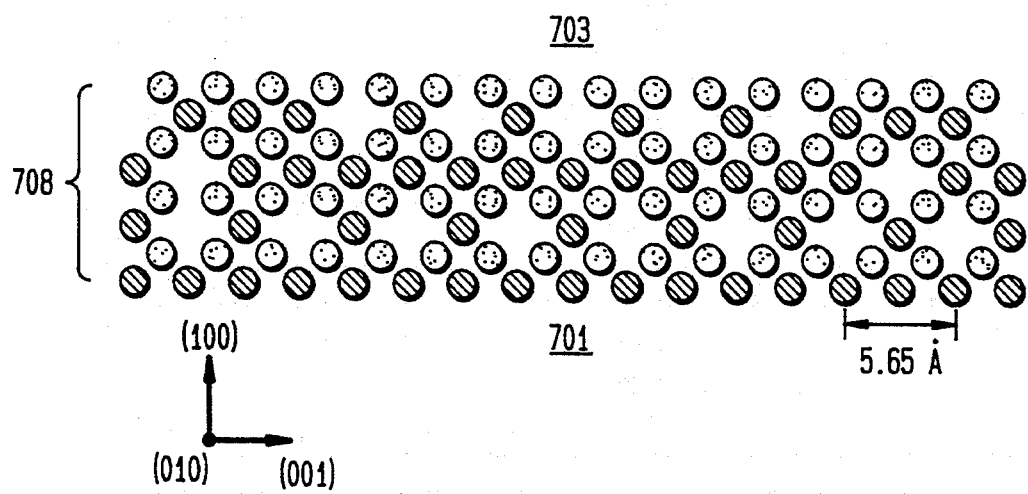

A semiconductor laser element of this example has a structure as shown in FIG. 7. After growing a GaAs layer 702 on a GaAs substrate 701, the temperature of the substrate is lowered to 300° C. while irradiating the substrate with As molecular beams. The surface structure is then confirmed to have changed from a (2×4) structure by the regular configuration of an As dimer to a c(4×4) structure.

A $Ga_2Se_3$ layer 703 is grown by supplying single molecular layer amounts of Ga molecular beams and Se molecular beams on the GaAs layer 702. The molecular beams are then stopped, and Se molecular beams are supplied. It is then confirmed that the surface has a (2×1) structure, which is the Se terminal surface structure. Then, a desired ZnSe type layer is grown.

For example, when a ZnSe layer 704 is epitaxially grown as the ZnSe type layer, the $Ga_2Se_3$ layer 703 is irradiated with Zn and Se molecular beams. In this step, the $Ga_2Se_3$ layer 703 is formed between the GaAs substrate 701 and the ZnSe type layer. The $Ga_2Se_3$ layer 703 is an epitaxial growth layer, whose structure and lattice coefficient are different from those of a bulk crystal.

In a case of growing an epitaxial layer on the GaAs substrate 701, when the substrate 701 has the c(4×4) structure, a characteristic reconstructive surface is formed by the effect of its surface structure. In four GaAs units 705 on the surface, a c(2×2) structure 707 regularly having four holes 706 is formed. The reconstructive structure 708 of $Ga_2Se_3$ buffers a strain caused by the mismatch with the lattice coefficient of the bulk crystal. Moreover, the ZnSe type layer formed thereon can be epitaxially grown on the Se terminal surface of the $Ga_2Se_3$, thereby attaining an excellent interface.

Example 5

The fifth example will now be described referring to FIG. 8.

A semiconductor laser element according to this example has a GaAs substrate 801, a GaAs layer 802 doped with Se, a $Ga_2Se_3$ layer 803 and a ZnSe layer 804.

When the GaAs layer 802 doped with Se atoms as an impurity is grown on the GaAs substrate 801 and the $Ga_2Se_3$ layer 803 is grown thereon in this manner, the mutual diffusion and the like on the hetero interface are prevented, thereby improving the composition sharpness in each layer. The other structures and the growing method of each layer are the same as those of Example 4.

Example 6

Figure 9:
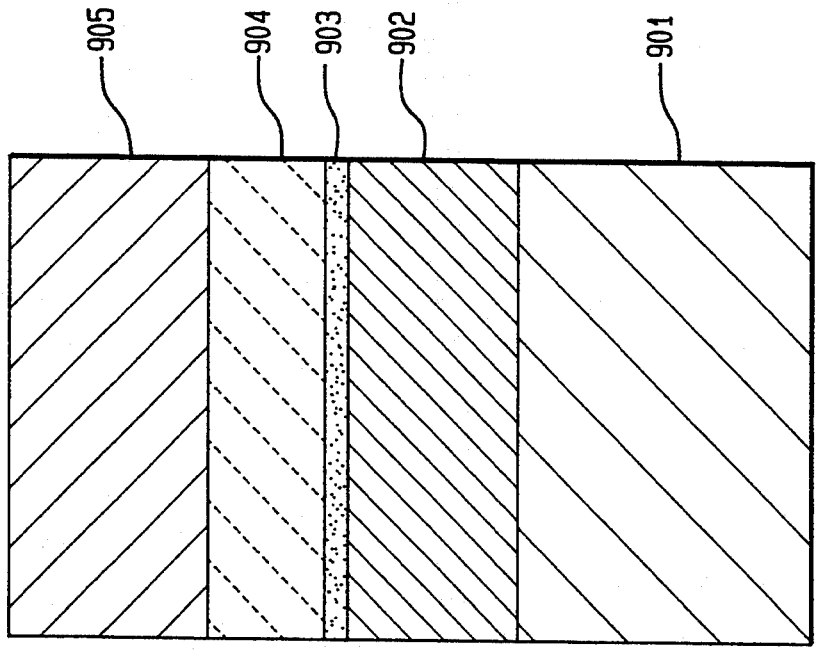
FIG. 9 is a sectional view of semiconductor epitaxial growth layers according to a sixth example of the present invention.

A semiconductor laser element according to this example has a GaAs substrate 901, a GaAs layer 902 doped with Se, a Se delta-doped layer 903, a $Ga_2Se_3$ layer 904 and a ZnSe layer 905 as shown in FIG. 9.

When the Se delta-doped single molecular layer 903 is formed on the surface of the GaAs layer 902, the mutual diffusion on the interface with the $Ga_2Se_3$ layer 904 formed thereon can be prevented, thereby realizing an excellent hetero interface. The other structures and the growing method of each layer are the same as those of Example 5.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for epitaxially growing a II–VI compound semiconductor comprising the steps of:

epitaxially growing a GaAs layer while doping Se as n-type an impurity, doping amount of the Se being gradually increased so that a density of the Se on the uppermost portion being approximately $10^{21}$ cm$^{-3}$;

epitaxially growing a GaAs$_x$Se$_{1-x}$ layer on the GaAs layer; and epitaxially growing a layer selected from the group consisting of a ZnSe layer and a compound semiconductor layer including ZnSe on the GaAs$_x$Se$_{1-x}$ layer.

2. A method according to claim 1, wherein the density of the Se on the uppermost portion of the GaAs layer is in the range of from 1 to $5 \times 10^{21}$ cm$^{-3}$.

3. A method for epitaxially growing a II-VI compound semiconductor comprising the steps of:

epitaxially growing a GaAs layer while doping Se as an n-type impurity, a doping amount of the Se being gradually increased so that a density of the Se on the uppermost portion is approximately $10^{21}$ cm$^{-3}$;

epitaxially growing a GaAs$_x$Se$_{1-x}$ layer on the GaAs layer; and epitaxially growing a layer selected from the group consisting of a ZnSe layer and a compound semiconductor layer including ZnSe on the GaAs$_x$Se$_{1-x}$ layer.

4. A method for epitaxially growing a II-VI compound semiconductor comprising the steps of:

epitaxially growing a Ga$_2$Se$_3$ layer on a GaAs substrate; and epitaxially growing a layer selected from the group consisting of a ZnSe layer and a compound semiconductor layer including ZnSe on the Ga$_2$Se$_3$ layer.

5. A method according to claim 4, wherein the compound semiconductor layer including ZnSe is a II-VI compound semiconductor comprising ZnSe and at least one selected from the group consisting of Cd and Hg belonging to the group IIB; Be, Mg, Ca, Sr, Bi and Mn belonging to the group IIA; S, Se and Te belonging to the group VI; and Mn belonging to the group VIIB.

6. A method for epitaxially growing a II-VI compound semiconductor comprising the steps of:

epitaxially growing a GaAs layer while doping Se as an n-type impurity, doping amount of the Se being gradually increased so that a density of the Se on the uppermost portion being approximately $10^{21}$ cm$^{-3}$;

epitaxially growing a Ga$_2$Se$_3$ layer on the GaAs layer; and epitaxially growing a layer selected from the group consisting of a ZnSe layer and a compound semiconductor layer including ZnSe on the Ga$_2$Se$_3$ layer.

7. A method according to claim 6, wherein the density of the Se on the uppermost portion of the GaAs layer is in the range of from 1 to $5 \times 10^{21}$ cm$^{-3}$.

8. A method for epitaxially growing a II-VI compound semiconductor comprising the steps of:

epitaxially growing a GaAs layer while doping Se as an n-type impurity, a doping amount of the Se being gradually increased so that a density of the Se on the uppermost portion is approximately $10^{21}$ cm$^{-3}$;

epitaxially growing a Ga$_2$Se$_3$ layer on the GaAs layer; and epitaxially growing a layer selected from the group consisting of a ZnSe layer and a compound semiconductor layer including ZnSe on the Ga$_2$Se$_3$ layer.

* * * * *

UNITED STATES PATENT AND TRADEMARK OFFICE
CERTIFICATE OF CORRECTION

PATENT NO. : 5,372,970
DATED : Dec. 13, 1994
INVENTOR(S) : Kubo

It is certified that error appears in the above-indentified patent and that said Letters Patent is hereby corrected as shown below:

The title page and columns 1-8 should be deleted to be replaced with the title page and columns 1-8 as shown on the attached sheets.

Signed and Sealed this

Thirteenth Day of June, 1995

Attest:

BRUCE LEHMAN

Attesting Officer

Commissioner of Patents and Trademarks

United States Patent [19]

Kubo

[11] Patent Number: 5,372,970

[45] Date of Patent: Dec. 13, 1994

[54] METHOD FOR EPITAXIALLY GROWING A II-VI COMPOUND SEMICONDUCTOR

[75] Inventor: Minoru Kubo, Nabari, Japan

[73] Assignee: Matsushita Electric Industrial Co., Ltd., Osaka, Japan

[21] Appl. No.: 81,806

[22] Filed: Jun. 23, 1993

[30] Foreign Application Priority Data

Jun. 24, 1992 [JP] Japan .................................. 4-165847

[51] Int. Cl.$^5$ .............................................. H01L 21/20
[52] U.S. Cl. .................................... 437/129; 437/105; 437/133; 148/DIG. 64
[58] Field of Search ................... 437/129, 133, 105; 148/6, DIG. 64; 156/DIG. 72

[56] References Cited

U.S. PATENT DOCUMENTS 5,213,998  5/1993  Qiu et al. ............................ 437/129

FOREIGN PATENT DOCUMENTS

| 0319207 | 6/1989 | European Pat. Off. | 437/129 |
| 0011760 | 3/1983 | Japan | 437/129 |
| 0258929 | 12/1985 | Japan | 148/DIG. 64 |
| 3-215398 | 9/1991 | Japan | 437/129 |

OTHER PUBLICATIONS

M. Sauvage-Simkin et al., *Physical Review Letters*, vol. 62, No. 5, "Fractional Stoichiometry of the GaAs(001)c (4×4) Surface: An In-Situ X-Ray Scattering Study", Jan. 30, 1989, pp. 563–566.

M. A. Haase et al. "Blue Green diodes", *Appl. Phys. Lett.* 59(11), 9 Sep. 1991, pp. 1272–1274.

Y. Horikoshi et al. "Low-Temperature Growth of GaAs and AlAs–GaAs Quantum-Well Layers by Modified Beam Epitaxy", *Japanese Journal of Applied Physics*, vol. 25, No. 10, Oct. 1986, pp. L868–L870.

Kobayashi in "Zinc selenide/Gallium arsenide heterointerface...", Jpn. Jn. Appl. Phys. part 2,27(9), 1988, L1597–L1599.

Moriizumi et al. in "Epitaxial Vapor growth of ZnTe on InAs" in Jpn. J. Appl. Phys. vol. 9, 1970, pp. 849–850.

*Primary Examiner*—R. Bruce Breneman
*Assistant Examiner*—Ramamohan Rao Paladugu
*Attorney, Agent, or Firm*—Ratner & Prestia

[57] ABSTRACT

A method for epitaxially growing a II–VI compound semiconductor according to this invention comprises the steps of epitaxially growing a $GaAs_xSe_{1-x}$ layer on a GaAs substrate and epitaxially growing a ZnSe layer or a compound semiconductor layer including ZnSe on the $GaAs_xSe_{1-x}$ layer. This method provides a II–VI compound semiconductor in which a strain caused by a lattice mismatch is prevented and the hetero interface is excellent.

8 Claims, 8 Drawing Sheets

METHOD FOR EPITAXIALLY GROWING A II-VI COMPOUND SEMICONDUCTOR

BACKGROUND OF THE INVENTION

1. Field of the Invention

The present invention relates to a method for epitaxially growing a ZnS(Se) type II-VI compound semiconductor, which is used for a blue light emitting element. More particularly, the present invention relates to a method for epitaxially growing a ZnS(Se) type II-VI compound semiconductor in which the strain and interface defects caused by a lattice mismatch with a GaAs substrate are controlled, and to a semiconductor laser element produced by the method.

2. Description of the Related Art

A semiconductor laser will be described as an example of a conventional blue light emitting element referring to FIG. 10.

An n-type GaAs substrate 1 is loaded in a molecular beam epitaxial (hereinafter referred to as the "MBE") growth apparatus with a high vacuum. In the apparatus, the surface of the substrate 1 is heated to approximately 600° C. and irradiated with As molecular beams. The surface of the substrate 1 is thus cleaned. Then, an n-type GaAs layer 2 is grown on the substrate 1 to approximately 100 nm at the same temperature by the MBE method. An n-type ZnSe layer 3 is grown on the n-type GaAs layer 2, and then, an n-type ZnSSe layer 4, n-type ZnSe layer 5, a CdZnSe layer 6, a p-type ZnSe layer 7, a p-type ZnSSe layer 8 and a p-type ZnSe layer 9 are successively grown thereon. An element having a sectional structure as shown in FIG. 10 is thus produced (M. A. Haase, J. Qiu, J. M. DePuydt and H. Cheng, Appl. Phys. Lett. Vol. 59, 1991, p. 1272). On the p-type ZnSe layer 9, an insulating film 10 is formed. A gold layer 11 and an indium layer 12 are formed as a p-type and an n-type electrodes, respectively, so as to sandwich the thus obtained laminated structure. These layers can be grown in the same or different MBE growth chambers.

The thus produced semiconductor laser can be oscillated by pulse driving at room temperature.

In the element having the above-mentioned laminated structure, the lattice mismatch between the crystal of ZnSe and that of GaAs is about 0.25%. However, the lattice mismatch between the crystal of CdZnSe or ZnSSe, that is, a mixed crystal of Zn together with Cd or together with S, and the crystal of ZnSe is significantly large. Moreover, since a coefficient of thermal expansion of the substrate between the epitaxial growth temperature and room temperature is different from that of each growth layer, a large stress is caused between the substrate and the growth layers. Dislocation is caused by such a stress in each of the growth layers, resulting in extremely shortening the life time of the semiconductor laser. Further, a difference in the band gap on the interface between GaAs and ZnSe (hereinafter referred to as the "hetero interface") is approximately 1.3 eV at room temperature, and largely prevents current injection. The hetero interface also has a problem of impurity diffusion caused by mutual diffusion between the constitutive atoms. Such an impurity can also prevent the current injection.

In this manner, in an element produced by epitaxially growing a ZnSe layer, that is, a II-VI compound layer, on a GaAs substrate, a density of dislocation is extremely high and the element has a very short life time. This is because:

a) Dislocation is caused due to a large lattice mismatch between the substrate and the ZnSe layer; and b) Dislocation is caused due to a large difference between the substrate and the ZnSe layer in the coefficient of thermal expansion from the growth temperature to room temperature.

In order to solve this problem, an MEE (migration enhanced epitaxy) (Y. Horikoshi et al., Japan J. Appl. Phys. Vol. 25, 1986, L868.) and an ALE (atomic layer epitaxy) have been used to attempt to grow layers at a low temperature. But they are not perfect methods.

In this manner, dislocation is caused and a density of the dislocation can not be reduced in such a conventional semiconductor laser. Moreover, it is considered that 50% or more of the injected current is thermally lost because of a difference in the band gap on the hetero interface of GaAs and ZnSe and a resistance component caused by mutual diffusion on the interface.

SUMMARY OF THE INVENTION

The method for epitaxially growing a II-VI compound semiconductor of this invention comprises the steps of epitaxially growing a $GaAs_xSe_{1-x}$ layer on a GaAs substrate; and epitaxially growing a layer selected from the group consisting of a ZnSe layer and a compound semiconductor layer including ZnSe on the $GaAs_xSe_{1-x}$ layer.

Alternatively, the method for epitaxially growing a II-VI compound semiconductor of this invention comprises the steps of epitaxially growing a $Ga_2Se_3$ layer on a GaAs substrate; and epitaxially growing a layer selected from the group consisting of a ZnSe layer and a compound semiconductor layer including ZnSe on the $Ga_2Se_3$ layer.

Thus, the invention described herein makes possible the advantages of (1) providing a method for epitaxially growing a II-VI compound semiconductor in which dislocation on an interface between a substrate and a growth layer is almost totally prevented; (2) providing a method for epitaxially growing a II-VI compound semiconductor in which a difference in the band gap on a hetero interface and a resistance component produced by mutual diffusion on the interface can be almost totally prevented; (3) providing a method for epitaxially growing a II-VI compound semiconductor having an excellent hetero interface on which a strain caused by a lattice mismatch is almost totally prevented by forming a $GaAs_xSe_{1-x}$ layer between a GaAs substrate and a ZnSe type layer; (4) providing a method for epitaxially growing a II-VI compound semiconductor in which a stress is buffered and dislocation is almost totally prevented by forming a $Ga_2As_3$ layer between a GaAs substrate and a ZnSe type layer; (5) providing a method for epitaxially growing a II-VI compound semiconductor in which the quality of a hetero interface is further improved by using a GaAs layer doped with Se or a Se single molecular layer doped with an impurity; and (6) providing a semiconductor laser element having a ZnSSe type II-VI compound semiconductor in which a strain caused by a lattice mismatch is almost totally prevented and an excellent hetero interface is realized.

These and other advantages of the present invention will become apparent to those skilled in the art upon reading and understanding the following detailed description with reference to the

BRIEF DESCRIPTION OF THE DRAWINGS

FIG. 1 is a sectional view of semiconductor epitaxial growth layers according to a first example of the present invention.

FIG. 2 illustrates the surface of a GaAs layer in the first example of the present invention.

FIG. 3 illustrates the surface of a $GaAs_xSe_{1-x}$ layer in the first example of the present invention.

FIG. 4 illustrates the hetero interface of the GaAs and GaSe layers in the first example of the present invention.

FIG. 5 is a sectional view of semiconductor epitaxial growth layers according to a second example of the present invention.

FIG. 6 is a sectional view of semiconductor epitaxial growth layers according to a third example of the present invention.

FIG. 7 is a sectional view of semiconductor epitaxial growth layers according to a fourth example of the present invention.

Figure 8:
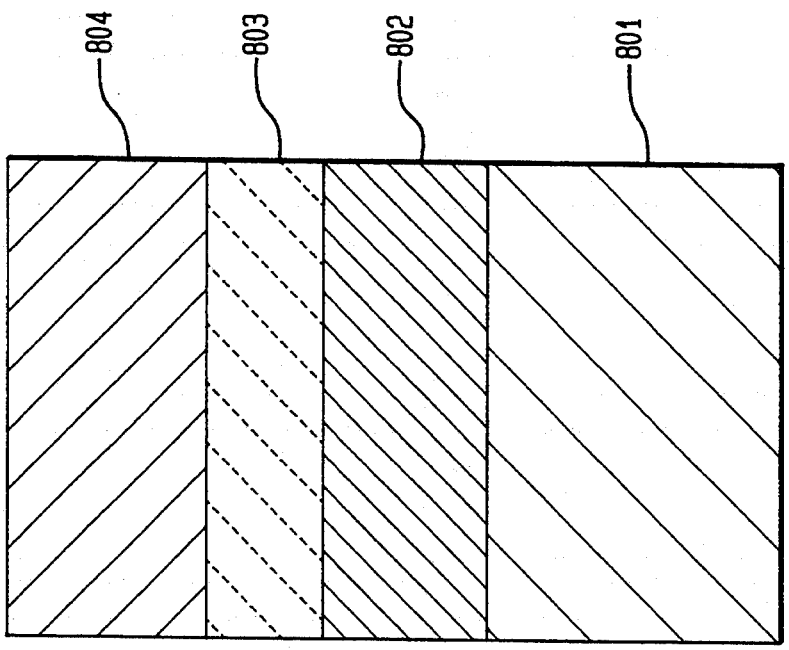
FIG. 8 is a sectional view of semiconductor epitaxial growth layers according to a fifth example of the present invention.

FIG. 8 is a sectional view of semiconductor epitaxial growth layers according to a fifth example of the present invention.

FIG. 9 is a sectional view of semiconductor epitaxial growth layers according to a sixth example of the present invention.

Figure 10:
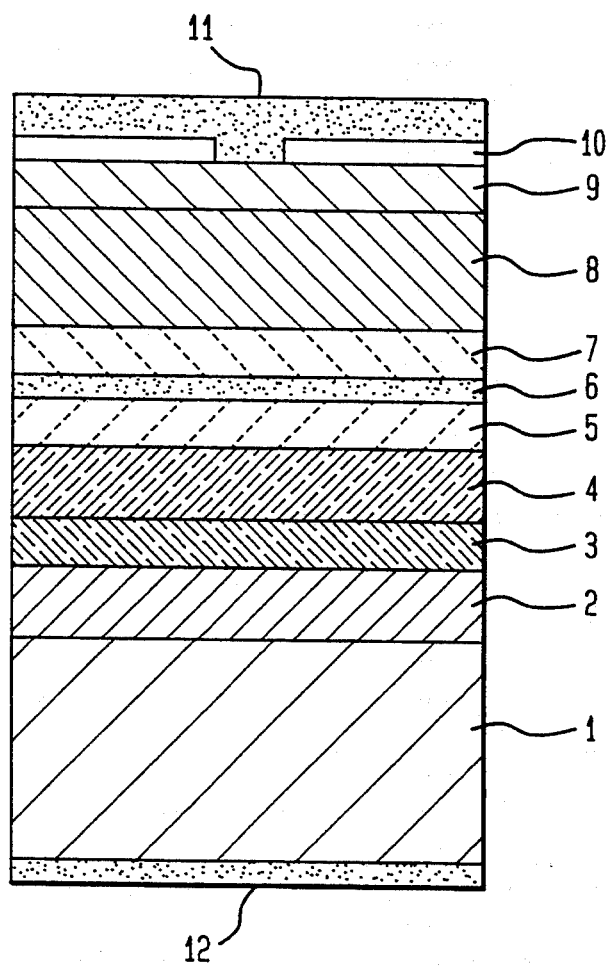
FIG. 10 is a sectional view of semiconductor epitaxial growth layers of a conventional semiconductor laser element.

FIG. 10 is a sectional view of semiconductor epitaxial growth layers of a conventional semiconductor laser element.

DESCRIPTION OF THE PREFERRED EMBODIMENTS

The present invention attains the above-mentioned advantages by the following two methods:

According to the first method, a $GaAs_xSe_{1-x}$ layer is epitaxially grown on a GaAs substrate, and a ZnSe layer or a compound semiconductor layer including ZnSe is then epitaxially grown thereon. A compound semiconductor having the compound semiconductor layer including ZnSe is a II–VI compound semiconductor comprising ZnSe and at least one selected from the group consisting of Cd and Hg belonging to the group IIB; Be, Mg, Ca, Sr, Bi and Mn belonging to the group IIA; S, Se and Te belonging to the group VI; and Mn belonging to the group VIIB. Examples of such a compound include CdZnSe, CdZnSeS, CdZnSeTe, MgZnSe, MgZnSeS, MgZnSeTe, MnZnSe, MnZnSeS and MnZnSeTe. In the semiconductor element produced by this method, because of the $GaAs_xSe_{1-x}$ layer existing between the GaAs substrate and the ZnSe type layer (i.e., the ZnSe layer or the compound semiconductor layer including ZnSe), a strain caused by a lattice mismatch therebetween can be buffered.

The quality of a hetero interface between the GaAs layer and the ZnSe layer can be further improved by preventing a strain caused by the lattice mismatch on the hetero interface as follows: Before growing the $GaAs_xSe_{1-x}$ layer, a GaAs layer doped with Se is grown on the GaAs substrate in a manner that the content of Se is increased toward the surface of the GaAs layer; or a GaAs layer doped with Se is first grown on the GaAs substrate, and a Se layer with a thickness approximately of a single molecular (hereinafter referred to as the "Se single molecular layer") is grown on the GaAs layer doped with Se to form a Se delta-doped layer. The wording "delta-doped" herein means that an element, that is, Se in this case, is distributed in a layer without diffusing in the adjacent crystal layers, that is, the GaAs layer doped with Se, the $GaAs_xSe_{1-x}$ layer and the $Ga_2Se_3$ layer in this case.

When a GaAs layer doped with Se is grown on a GaAs substrate, it is preferable to increase the doping amount of Se toward the uppermost portion of the GaAs layer so that the density of Se in the uppermost portion is approximately $10^{21}$ cm$^{-3}$, and preferably from 1 to $5 \times 10^{21}$ cm$^{-3}$.

According to the second method, a $Ga_2Se_3$ layer is epitaxially grown on a GaAs substrate, and a ZnSe type layer (a ZnSe layer or a compound semiconductor layer including ZnSe) is epitaxially grown thereon. In the semiconductor element produced by this method, since the $Ga_2Se_3$ layer is disposed between the GaAs substrate and the ZnSe type layer, a stress therebetween is buffered, thereby preventing causing dislocation.

Similarly to the first method, the quality of a hetero interface between the GaAs layer and the ZnSe layer can be further improved by preventing a strain caused by the lattice mismatch on the hetero interface as follows: Before growing the $Ga_2Se_3$ layer, a GaAs layer doped with Se is grown on the GaAs substrate in a manner that the content of Se is increased toward the surface of the GaAs layer; or a GaAs layer doped with Se is first grown on the GaAs substrate, and a Se single molecular layer is grown on the GaAs layer doped with Se to form a Se delta-doped layer.

EXAMPLES

The present invention will now be described in detail by way of examples.

Example 1

Semiconductor growth layers according to this example as shown in FIG. 1 are produced as follows: A GaAs substrate 101 is loaded in an MBE growth apparatus with a high vacuum. The surface of the substrate 101 is heated to approximately 600° C. and irradiated with As molecular beams to be cleaned. A GaAs layer 102 as a buffer layer is then grown on the substrate 101 by approximately 100 nm.

After growing the GaAs layer 102, the temperature of the surface of the substrate 101 is lowered to 300° C. while being irradiated with As molecular beams. The surface structure is then confirmed to have changed from a (2×4) structure by a regular configuration of an As dimer to a c(4×4) structure.

FIG. 2 shows the c(4×4) structure, in which the surface coverage by As is increased (M. Sauvage-Simkin et al., Physical Review Letters, Vol. 62, pp. 563–566 (1989)).

While irradiating the surface of the GaAs layer 102 with As molecular beams, a $GaAs_xSe_{1-x}$ layer 103 is grown by irradiating with single molecular layer amounts of Ga molecular beams and Se molecular beams, respectively. The molecular beams are then stopped, and Se molecular beams are irradiated. It is then confirmed that the surface has a (2×1) structure, which is the Se terminal surface structure. Next, a desired ZnSe type layer is grown thereon. For example, when a ZnSe layer 104 is epitaxially grown as the ZnSe type layer, the $GaAs_xSe_{1-x}$ 103 is irradiated with molecular beams of Zn and Se. As typical growth conditions, a ratio of Zn molecular beams to Se molecular beams is approximately 1.4 at 300° C. of the surface temperature of the substrate 101, and the growth rate is approximately 1000 nm/hour In the above-mentioned step, the layer formed on the GaAs substrate 101 first has a structure of a $GaAs_xSe_{1-x}$ type ternary mixed crystal as shown in FIG. 3. The thickness of the $GaAs_xSe_{1-x}$ layer is set to be from a single molecular thickness to one of several molecular thicknesses, wherein x is varied from 0 to 1 discontinuously. Although there is a large difference in the crystal structure and the lattice coefficient a between GaAs (i.e., x=1) and GaSe (i.e., x=0), the strain between these layers can be reduced by successively varying the component over several molecular layers.

The GaAs crystal has a zinc-blende structure and a lattice coefficient a of 5.657 angstroms. The GaSe crystal has a layered structure formed by the Van der Waals forces and a lattice coefficient a of 7.97 angstroms. Although the lattice coefficients are thus largely different, the unit structure of the surface of the zinc-blende structure of the GaAs crystal has an atom configuration with a size of each side of 4 angstroms. This size is approximate to 3.76 angstroms, which is one half of the lattice coefficient of the GaSe crystal.

Therefore, the lattice mismatch between these layers is 6.4% in this case. This lattice mismatch can be sufficiently buffered on the interface where x is varied from 0 to 1, that is, the interface between GaAs and GaSe.

On a hetero interface having a structure as shown in FIG. 4, a strain caused by a lattice mismatch and the effect of dislocation are buffered since the GaAs layer formed on the GaAs layer 400 has a layered structure having the Van der Waals forces even if the GaSe layer 404 has a thickness of approximately a single molecule.

Example 2

FIG. 5 shows a sectional view of a layered structure of a semiconductor laser element produced by an epitaxial growing method according to another example of this invention.

The semiconductor element has a GaAs substrate 501, a GaAs layer 502 doped with Se, a $GaAs_xSe_{1-x}$ layer 503 and a ZnSe layer 504.

When the GaAs layer 502 doped with Se atoms as an impurity is grown on the GaAs substrate 501, and the $GaAs_xSe_{1-x}$ layer 503 is grown thereon in this manner, the mutual diffusion on the hetero interface is prevented, thereby improving the abruptness of composition in each layer. The other structures and the growing method of each layer are the same as those of Example 1.

Example 3

A semiconductor laser element according to this example shown in FIG. 6 has a GaAs substrate 601, a GaAs layer 602 doped with Se, a delta-doped Se layer 603, a $GaAs_xSe_{1-x}$ layer 604 and a ZnSe layer 605.

By providing the Se delta-doped single molecular layer on the surface of the GaAs layer 602, the $GaAs_xSe_{1-x}$ layer 604 formed thereon can be a GaSe layer. Since GaSe has a layered structure as mentioned above, dislocation and the like can be prevented. Other structures and the growing method of each layer are the same as those of Example 2.

Example 4

A semiconductor laser element of this example has a structure as shown in FIG. 7. After growing a GaAs layer 702 on a GaAs substrate 701, the temperature of the substrate is lowered to 300° C. while irradiating the substrate with As molecular beams. The surface structure is then confirmed to have changed from a $(2 \times 4)$ structure by the regular configuration of an As dimer to a $c(4 \times 4)$ structure.

A $Ga_2Se_3$ layer 703 is grown by supplying single molecular layer amounts of Ga molecular beams and Se molecular beams on the GaAs layer 702. The molecular beams are then stopped, and Se molecular beams are supplied. It is then confirmed that the surface has a $(2 \times 1)$ structure, which is the Se terminal surface structure. Then, a desired ZnSe type layer is grown.

For example, when a ZnSe layer 704 is epitaxially grown as the ZnSe type layer, the $Ga_2Se_3$ layer 703 is irradiated with Zn and Se molecular beams. In this step, the $Ga_2Se_3$ layer 703 is formed between the GaAs substrate 701 and the ZnSe type layer. The $Ga_2Se_3$ layer 703 is an epitaxial growth layer, whose structure and lattice coefficient are different from those of a bulk crystal.

In a case of growing an epitaxial layer on the GaAs substrate 701, when the substrate 701 has the $c(4 \times 4)$ structure, a characteristic reconstructive surface is formed by the effect of its surface structure. In four GaAs units 705 on the surface, a $c(2 \times 2)$ structure 707 regularly having four holes 706 is formed. The reconstructive structure 708 of $Ga_2Se_3$ buffers a strain caused by the mismatch with the lattice coefficient of the bulk crystal. Moreover, the ZnSe type layer formed thereon can be epitaxially grown on the Se terminal surface of the $Ga_2Se_3$, thereby attaining an excellent interface.

Example 5

The fifth example will now be described referring to FIG. 8.

A semiconductor laser element according to this example has a GaAs substrate 801, a GaAs layer 802 doped with Se, a $Ga_2Se_3$ layer 803 and a ZnSe layer 804.

When the GaAs layer 802 doped with Se atoms as an impurity is grown on the GaAs substrate 801 and the $Ga_2Se_3$ layer 803 is grown thereon in this manner, the mutual diffusion and the like on the hetero interface are prevented, thereby improving the composition sharpness in each layer. The other structures and the growing method of each layer are the same as those of Example 4.

Example 6

A semiconductor laser element according to this example has a GaAs substrate 901, a GaAs layer 902 doped with Se, a Se delta-doped layer 903, a $Ga_2Se_3$ layer 904 and a ZnSe layer 905 as shown in FIG. 9.

When the Se delta-doped single molecular layer 903 is formed on the surface of the GaAs layer 902, the mutual diffusion on the interface with the $Ga_2Se_3$ layer 904 formed thereon can be prevented, thereby realizing an excellent hetero interface. The other structures and the growing method of each layer are the same as those of Example 5.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for epitaxially growing a II–VI compound semiconductor comprising the steps of:

epitaxially growing a GaAs layer while doping Se as an n-type impurity, a doping amount of the Se being gradually increased so that a density of the Se on the uppermost portion is approximately $10^{21}$ cm$^{-3}$;

epitaxially growing a GaAs$_x$Se$_{1-x}$ layer on the GaAs layer; and epitaxially growing a layer selected from the group consisting of a ZnSe layer and a compound semiconductor layer including ZnSe on the GaAs$_x$Se$_{1-x}$ layer.

2. A method according to claim 1, wherein the density of the Se on the uppermost portion of the GaAs layer is in the range of from 1 to $5 \times 10^{21}$ cm$^{-3}$.

3. A method for epitaxially growing a II–VI compound semiconductor comprising the steps of:

eptiaxially growing a GaAs layer on a GaAs substrate while doping Se as an n-type impurity;

forming a Se delta-doped distribution on an uppermost surface of the GaAs layer by supplying a single molecular layer amount of Se alone;

epitaxially growing a GaAs$_x$Se$_{1-x}$ layer on the Se delta-doped distribution; and epitaxially growing a layer selected from the group consisting of a ZnSe layer and a compound semiconductor layer including ZnSe on the GaAs$_x$Se$_{1-x}$ layer.

4. A method for epitaxially growing a II–VI compound semiconductor comprising the steps of:

epitaxially growing a Ga$_2$Se$_3$ layer on a GaAs substrate; and epitaxially growing a layer selected from the group consisting of a ZnSe layer and a compound semiconductor layer including ZnSe on the Ga$_2$Se$_3$ layer.

5. A method according to claim 4, wherein the compound semiconductor layer including ZnSe is a II–VI compound semiconductor comprising ZnSe and at least one selected from the group consisting of Cd and Hg belonging to the group IIB; Be, Mg, Ca, Sr, Bi and Mn belonging to the group IIA; S, Se and Te belonging to the group VI; and Mn belonging to the group VIIB.

6. A method for epitaxially growing a II–VI compound semiconductor comprising the steps of:

epitaxially growing a GaAs layer while doping Se as an n-type impurity, a doping amount of the Se being gradually increased so that a density of the Se on the uppermost portion is approximately $10^{21}$ cm$^{-3}$;

epitaxially growing a Ga$_2$Se$_3$ layer on the GaAs layer; and epitaxially growing a layer selected from the group consisting of a ZnSe layer and a compound semiconductor layer including ZnSe on the Ga$_2$Se$_3$ layer.

7. A method according to claim 6, wherein the density of the Se on the uppermost portion of the GaAs layer is in the range of from 1 to $5 \times 10^{21}$ cm$^{-3}$.

8. A method for epitaxially growing a II–VI compound semiconductor comprising the steps of:

epitaxially growing a GaAs layer on a GaAs substrate while doping Se as an n-type impurity;

forming a Se delta-doped distribution on an uppermost surface of the GaAs layer by supplying a single molecular layer amount of Se alone;

epitaxially growing a Ga$_2$Se$_3$ layer on the Se delta-doped distribution; and epitaxially growing a layer selected from the group consisting of a ZnSe layer and a compound semiconductor layer including ZnSe on the Ga$_2$Se$_3$ layer.

* * * * *